(12) United States Patent
Cao

(10) Patent No.: US 9,379,692 B2
(45) Date of Patent: Jun. 28, 2016

(54) COMPARATOR

(71) Applicant: SHENZHEN CHINA STAR OPTOELECTRONICS TECHNOLOGY CO., LTD, Shenzhen (CN)

(72) Inventor: Dan Cao, Shenzhen (CN)

(73) Assignee: SHENZHEN CHINA STAR OPTOELECTRONICS TECHNOLOGY CO., LTD, Guangdong (CN)

( * ) Notice: Subject to any disclaimer, the term of this patent is extended or adjusted under 35 U.S.C. 154(b) by 17 days.

(21) Appl. No.: 14/401,848

(22) PCT Filed: Sep. 12, 2014

(86) PCT No.: PCT/CN2014/086361
§ 371 (c)(1),
(2) Date: Nov. 18, 2014

(87) PCT Pub. No.: WO2016/029513
PCT Pub. Date: Mar. 3, 2016

(65) Prior Publication Data
US 2016/0065198 A1 Mar. 3, 2016

(30) Foreign Application Priority Data
Aug. 26, 2014 (CN) .......................... 2014 1 0424215

(51) Int. Cl.
*H03K 5/22* (2006.01)
*H03K 5/24* (2006.01)

(52) U.S. Cl.
CPC ................................. *H03K 5/2472* (2013.01)

(58) Field of Classification Search
None
See application file for complete search history.

(56) References Cited

U.S. PATENT DOCUMENTS

| 5,656,957 A * | 8/1997 | Marlow | ............... H03K 3/3565 327/67 |
| 6,208,187 B1 * | 3/2001 | Callahan, Jr. | ...... H03K 3/02337 327/65 |
| 6,486,727 B1 | 11/2002 | Kwong | |
| 2002/0113627 A1 * | 8/2002 | Iga | ....................... H03K 5/2481 327/108 |
| 2005/0140427 A1 | 6/2005 | Kamijo et al. | |
| 2006/0186928 A1 | 8/2006 | Liu et al. | |

FOREIGN PATENT DOCUMENTS

| CN | 1638277 A | 7/2005 |
| CN | 1758540 A | 4/2006 |
| CN | 103023437 A | 4/2013 |

\* cited by examiner

*Primary Examiner* — Long Nguyen
(74) *Attorney, Agent, or Firm* — Mark M. Friedman

(57) ABSTRACT

A comparator is disclosed. The comparator has a power input terminal used to input electricity, a first and a second to-be-compared voltage input terminal used to receive the first and second to-be-compared voltage, an offset voltage adjusting circuit used to adjust an offset voltage, a comparative circuit used to compare the first to-be-compared voltage and a third to-be-compared voltage which is a sum of the second to-be-compared voltage and the offset voltage and to generate a comparative result, and a comparative result output terminal used to output the comparative result.

11 Claims, 2 Drawing Sheets

COMPARATOR

BACKGROUND OF THE INVENTION

1. Field of Invention

The present invention relates to the field of electronic circuits, and in particular to a comparator.

2. Description of Prior Art

Generally, a conventional comparator is used to compare two voltage signals and to output a comparative result.

A range of an offset voltage of the conventional comparator is very narrow, and the offset voltage is caused by changes in the external environment.

Theoretically, while a value of V+ is equal to a value of V−, an output of the conventional comparator will be reversed. However, in practical situations, the output of the conventional comparator will be reversed only while there is a tiny offset voltage between the value of V+ and the value of V−; the tiny offset voltage is caused by changes in the external environment and is impossible to be controlled.

It is not possible to use a conventional comparator when the application environment is in any of the following conditions (applying conditions):

While the value of V+ is equal to the value of V− plus a value of V1, then the output of the conventional comparator is permitted to be reversed.

V1 indicates the offset voltage. The value of V1 is constant.

Therefore, a new technical solution is needed in order to solve the problems mentioned above.

SUMMARY OF THE INVENTION

The purpose of the present invention is to provide a comparator having an offset voltage which is adjustable according to the user's needs, thereby increasing the applicable situations of the comparator.

To achieve the above purposes, the present invention provides a technical proposal as below.

A comparator is provided, comprising: a power input terminal fed to electricity power supply, a first to-be-compared voltage input terminal used to receive the first to-be-compared voltage, a second to-be-compared voltage input terminal used to receive the second to-be-compared voltage; an offset voltage adjusting circuit used to adjust an offset voltage; a comparative circuit used to receive the first to-be-compared voltage and the second to-be-compared voltage, to compare the first to-be-compared voltage and a third to-be-compared voltage which is a sum of the second to-be-compared voltage and the offset voltage and to generate a comparative result; and a comparative result output terminal used to output the comparative result; the comparative circuit is coupled with the power input terminal, the comparative result output terminal, the offset voltage adjusting circuit, the first to-be-compared voltage input terminal, and the second to-be-compared voltage input terminal; the comparative circuit comprising: a first field effect transistor, comprising a first control terminal, a first connecting terminal coupled with the power input terminal, and a second connecting terminal coupled with the first control terminal; a second field effect transistor, comprising a second control terminal coupled with the first control terminal, a third connecting terminal coupled with the power input terminal, and a fourth connecting terminal; a third field effect transistor, comprising a third control terminal coupled with the fourth connecting terminal, a fifth connecting terminal coupled with the power input terminal, and a sixth connecting terminal coupled with the comparative result output terminal; a fourth field effect transistor, comprising a fourth control terminal coupled with the second to-be-compared voltage input terminal, a seventh connecting terminal coupled with the second connecting terminal, and an eighth connecting terminal; a fifth field effect transistor, comprising a fifth control terminal coupled with the first to-be-compared voltage input terminal, a ninth connecting terminal coupled with the fourth connecting terminal, and a tenth connecting terminal coupled with the eighth connecting terminal; a sixth field effect transistor, comprising a sixth control terminal coupled with the third control terminal, an eleventh connecting terminal coupled with the tenth connecting terminal, and a twelfth connecting terminal coupled with the comparative result output terminal. The first field effect transistor and the second field effect transistor form a current mirror.

In the comparator mentioned above, the first field effect transistor, the second field effect transistor, and the third field effect transistor are all P-channel metal-oxide-semiconductor field effect transistors; the fourth field effect transistor, the fifth field effect transistor, and the sixth field effect transistor are all N-channel metal-oxide-semiconductor field effect transistors.

In the comparator mentioned above, the offset voltage adjusting circuit comprises a first adjusting portion. The first adjusting portion comprises an adjusting resistance used to adjust the offset voltage by adjusting a resistant value R of the first adjusting portion, the offset voltage corresponds to a voltage of the first adjusting portion. The tenth connecting terminal is coupled with the eighth connecting terminal by the adjusting resistance, and the eleventh connecting terminal is coupled with the tenth connecting terminal by the adjusting resistance. The adjusting resistance comprises a thirteenth connecting terminal coupled with the tenth connecting terminal and a fourteenth connecting terminal coupled with the eighth connecting terminal and the eleventh connecting terminal.

In the comparator mentioned above, the offset voltage adjusting circuit comprises a second adjusting portion used to adjust the offset voltage by adjusting a current passing through the adjusting resistance. The eleventh connecting terminal is coupled with the fourteenth connecting terminal through the second adjusting portion.

In the comparator mentioned above, the second adjusting portion comprises a control voltage input terminal used to receive a control voltage. The control voltage is used to control the current passing through the adjusting resistance. A seventh field effect transistor, comprising a seventh control terminal coupled with the control voltage input terminal, a fifteenth connecting terminal coupled with the fourteenth connecting terminal, and a sixteenth connecting terminal coupled with the eleventh connecting terminal. An eighth field effect transistor, comprising an eighth control terminal coupled with the control voltage input terminal, a seventeenth connecting terminal coupled with the eight control terminal, and an eighteenth connecting terminal coupled with the sixteenth connecting terminal. The comparator further comprises a ground terminal used to be coupled with the sixteenth connecting terminal.

In the comparator mentioned above, each of the first field effect transistor, the second field effect transistor, and the seventh field effect transistor comprises a first number of the metal-oxide-semiconductors coupled in parallel; the eighth field effect transistor comprises a second number of the metal-oxide-semiconductors coupled in parallel, the first number is double the second number.

In the comparator mentioned above, a current passing through the first field effect transistor is equal to a current passing through the second field effect transistor; a current passing through the seventh field effect transistor is double the current passing through the second field effect transistor.

In the comparator mentioned above, the seventh field effect transistor and the eighth field effect transistor are both N-channel metal-oxide-semiconductor field effect transistors.

In the comparator mentioned above, while the first to-be-compared voltage is less than the third to-be-compared voltage, the fifth field effect transistor and the third field effect transistor are in an off-state, the sixth transistor is in an on-state, and the comparative result outputted from the comparative result output terminal is a low voltage signal; while the first to-be-compared voltage is higher than or equal to the third to-be-compared voltage, the fifth field effect transistor and the third field effect transistor are in an on-state, the sixth transistor is in an off-state, and the comparative result outputted from the comparative result output terminal is a high voltage signal.

In a comparator, the comparator comprising: a power input terminal fed to electricity power supply, a first to-be-compared voltage input terminal used to receive the first to-be-compared voltage, a second to-be-compared voltage input terminal used to receive the second to-be-compared voltage; an offset voltage adjusting circuit used to adjust an offset voltage; a comparative circuit used to receive the first to-be-compared voltage and the second to-be-compared voltage, to compare the first to-be-compared voltage and a third to-be-compared voltage which is a sum of the second to-be-compared voltage and the offset voltage and to generate a comparative result; and a comparative result output terminal used to output the comparative result; the comparative circuit is coupled with the power input terminal, the comparative result output terminal, the offset voltage adjusting circuit, the first to-be-compared voltage input terminal, and the second to-be-compared voltage input terminal.

In the comparator mentioned above, the comparative circuit comprising: a first field effect transistor, comprising a first control terminal, a first connecting terminal coupled with the power input terminal, and a second connecting terminal coupled with the first control terminal; a second field effect transistor, comprising a second control terminal coupled with the first control terminal, a third connecting terminal coupled with the power input terminal, and a fourth connecting terminal; a third field effect transistor, comprising a third control terminal coupled with the fourth connecting terminal, a fifth connecting terminal coupled with the power input terminal, and a sixth connecting terminal coupled with the comparative result output terminal; a fourth field effect transistor, comprising a fourth control terminal coupled with the second to-be-compared voltage input terminal, a seventh connecting terminal coupled with the second connecting terminal, and an eighth connecting terminal; a fifth field effect transistor, comprising a fifth control terminal coupled with the first to-be-compared voltage input terminal, a ninth connecting terminal coupled with the fourth connecting terminal, and a tenth connecting terminal coupled with the eighth connecting terminal; a sixth field effect transistor, comprising a sixth control terminal coupled with the third control terminal, an eleventh connecting terminal coupled with the tenth connecting terminal, and a twelfth connecting terminal coupled with the comparative result output terminal.

In the comparator mentioned above, the first field effect transistor, the second field effect transistor, and the third field effect transistor are all P-channel metal-oxide-semiconductor field effect transistors; the fourth field effect transistor, the fifth field effect transistor, and the sixth field effect transistor are all N-channel metal-oxide-semiconductor field effect transistors.

In the comparator mentioned above, the offset voltage adjusting circuit comprises a first adjusting portion. The first adjusting portion comprises an adjusting resistance used to adjust the offset voltage by adjusting a resistant value R of the first adjusting portion, the offset voltage corresponds to a voltage of the first adjusting portion. The tenth connecting terminal is coupled with the eighth connecting terminal by the adjusting resistance, and the eleventh connecting terminal is coupled with the tenth connecting terminal by the adjusting resistance. The adjusting resistance comprises a thirteenth connecting terminal coupled with the tenth connecting terminal and a fourteenth connecting terminal coupled with the eighth connecting terminal and the eleventh connecting terminal.

In the comparator mentioned above, the offset voltage adjusting circuit comprises a second adjusting portion used to adjust the offset voltage by adjusting a current passing through the adjusting resistance. The eleventh connecting terminal is coupled with the fourteenth connecting terminal through the second adjusting portion.

In the comparator mentioned above, the second adjusting portion comprises a control voltage input terminal used to receive a control voltage. The control voltage is used to control the current passing through the adjusting resistance. A seventh field effect transistor, comprising a seventh control terminal coupled with the control voltage input terminal, a fifteenth connecting terminal coupled with the fourteenth connecting terminal, and a sixteenth connecting terminal coupled with the eleventh connecting terminal. An eighth field effect transistor, comprising an eighth control terminal coupled with the control voltage input terminal, a seventeenth connecting terminal coupled with the eight control terminal, and an eighteenth connecting terminal coupled with the sixteenth connecting terminal. The comparator further comprises a ground terminal, coupled with the sixteenth connecting terminal.

In the comparator mentioned above, each of the first field effect transistor, the second field effect transistor, and the seventh field effect transistor comprises a first number of the metal-oxide-semiconductors coupled in parallel; the eighth field effect transistor comprises a second number of the metal-oxide-semiconductors coupled in parallel, the first number is double the second number.

In the comparator mentioned above, the second number is 1 and the first number is 2.

In the comparator mentioned above, a current passing through the first field effect transistor is equal to a current passing through the second field effect transistor; a current passing through the seventh field effect transistor is double the current passing through the second field effect transistor.

In the comparator mentioned above, the seventh field effect transistor and the eighth field effect transistor are both N-channel metal-oxide-semiconductor field effect transistors.

In the comparator mentioned above, while the first to-be-compared voltage is less than the third to-be-compared voltage, the fifth field effect transistor and the third field effect transistor are in an off-state, the sixth transistor is in an on-state, and the comparative result outputted from the comparative result output terminal is a low voltage signal; while the first to-be-compared voltage is higher than or equal to the third to-be-compared voltage, the fifth field effect transistor and the third field effect transistor are in an on-state, the sixth transistor is in an off-state, and the comparative result outputted from the comparative result output terminal is a high voltage signal.

Unlike the conventional art, the present invention allows the offset voltage to be adjusted according to the user's needs, thereby increasing the applicable situations of the comparator.

To allow the present invention to be more clearly understood, preferred embodiments are given below, and accompanied with drawings, and are described in detail as follows:

DETAILED DESCRIPTION OF THE PREFERRED EMBODIMENTS

Figure 1:
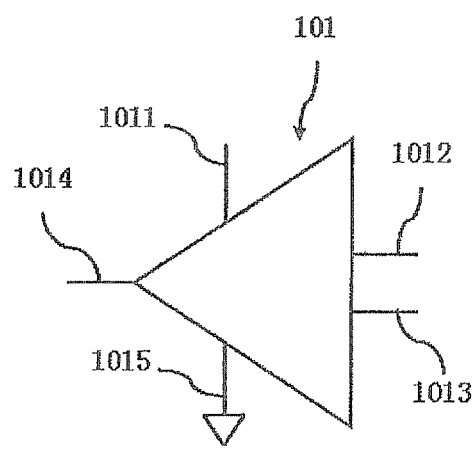
FIG. 1 is a diagram of a comparator of the present invention.

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention. In the drawings, components having similar structures are denoted by the same numerals.

Figure 2:
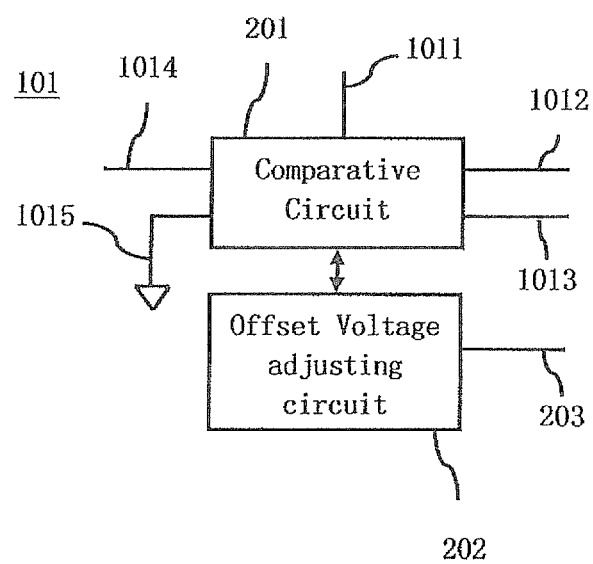
FIG. 2 is a block diagram of a comparator shown in FIG. 1 according to the present invention.

Refer to FIG. 1 and FIG. 2, FIG. 1 is a diagram of a comparator 101 of the present invention and FIG. 2 is a block diagram of a comparator 101 shown in FIG. 1 according to the present invention.

The comparator 101 of the present invention comprises a power input terminal 1011, a first to-be-compared voltage input terminal 1012, a second to-be-compared voltage input terminal 1013, an offset voltage adjusting circuit 202, a comparative circuit 201, and a comparative result output terminal 1014.

The power input terminal 1011 is fed to a power supply. The first to-be-compared voltage input terminal 1012 is used to receive the first to-be-compared voltage. The second to-be-compared voltage input terminal 1013 is used to receive the second to-be-compared voltage. The offset voltage adjusting circuit 202 is used to adjust an offset voltage. The comparative circuit 201 is used to receive the first to-be-compared voltage and the second to-be-compared voltage, to compare the first to-be-compared voltage and a third to-be-compared voltage, and to generate a comparative result. The third to-be-compared voltage is the sum of the second to-be-compared voltage and the offset voltage. A comparative result output terminal 1014 is used to output the comparative result.

The offset voltage adjusting circuit 202 is coupled with the comparative circuit 201. The comparative circuit 2021 is coupled with the power input terminal 1011, the comparative result output terminal 1014, the offset voltage adjusting circuit 202, the first to-be-compared voltage input terminal 1012, and the second to-be-compared voltage input terminal 1013.

Figure 3:
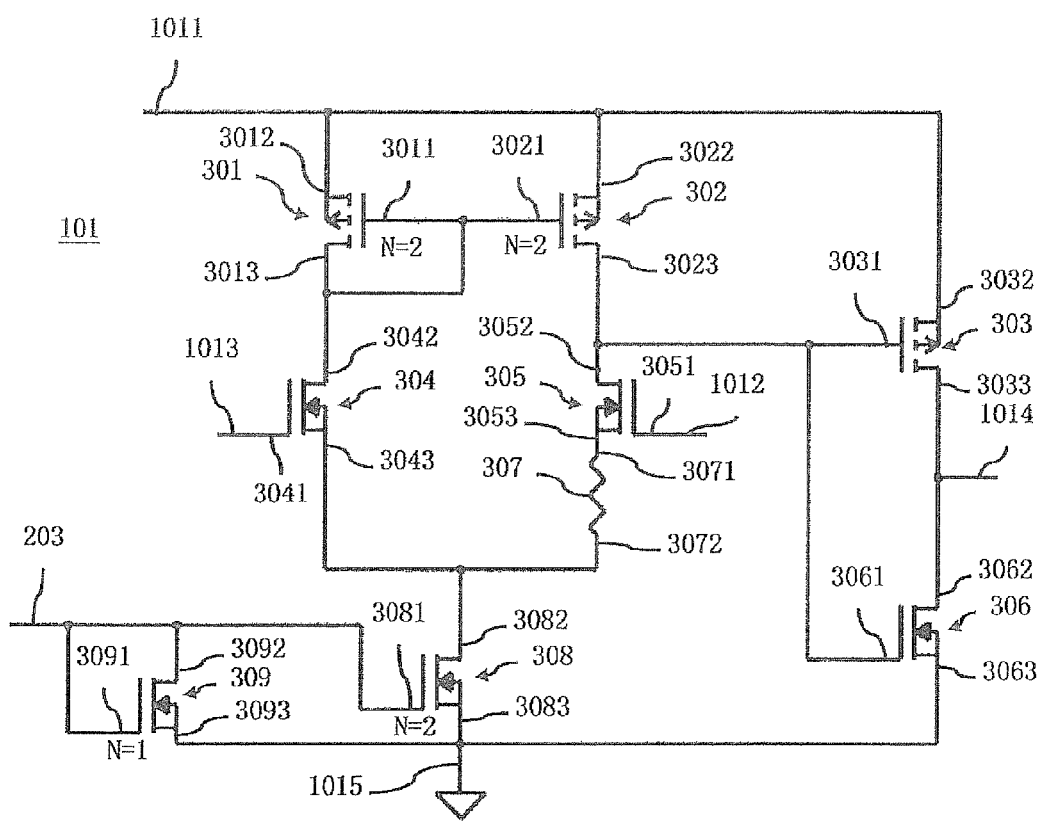
FIG. 3 is a circuit diagram of a comparator shown in FIG. 1 according to the present invention.

FIG. 3 is a circuit diagram of a comparator 101 shown in FIG. 1 according to the present invention. The comparative circuit 201 comprises a first field effect transistor (FET) 301, a second field effect transistor 302, a third field effect transistor 303, a fourth field effect transistor 304, a fifth field effect transistor 305, and a sixth field effect transistor 306.

The first field effect transistor 301 comprises a first control terminal 3011, a first connecting terminal 3012, and a second connecting terminal 3013. The first control terminal 3011 is coupled with the second connecting terminal 3013. The first connecting terminal 3012 is coupled with the power input terminal 1011. The second field effect transistor 302 comprises a second control terminal 3021, a third connecting terminal 3022, and a fourth connecting terminal 3023. The second control terminal 3021 is coupled with the first control terminal 3011. The third connecting terminal 3022 is coupled with the power input terminal 1011. The third field effect transistor 303 comprises a third control terminal 3031, a fifth connecting terminal 3032, and a sixth connecting terminal 3033. The third control terminal 3031 is coupled with the fourth connecting terminal 3023. The fifth connecting terminal 3032 is coupled with the power input terminal 1011. The sixth connecting terminal 3033 is coupled with the comparative result output terminal 1014. The fourth field effect transistor 304 comprises a fourth control terminal 3041, a seventh connecting terminal 3042, and an eighth connecting terminal 3043. The fourth control terminal 3041 is coupled with the second to-be-compared voltage input terminal 1013. The seventh connecting terminal 3042 is coupled with the second connecting terminal 3013. The fifth field effect transistor 305 comprises a fifth control terminal 3051, a ninth connecting terminal 3052, and a tenth connecting terminal 3053. The fifth control terminal 3051 is coupled with the first to-be-compared voltage input terminal 1012. The ninth connecting terminal 3052 is coupled with the fourth connecting terminal 3023. The tenth connecting terminal 3053 is coupled with the eighth connecting terminal 3043. The sixth field effect transistor 306 comprises a sixth control terminal 3061, an eleventh connecting terminal 3062, and a twelfth connecting terminal 3063. The sixth control terminal 3061 is coupled with the third control terminal 3031. The twelfth connecting terminal 3063 is coupled with the comparative result output terminal 1014. The eleventh connecting terminal 3062 is coupled with the tenth connecting terminal 3053.

In the present embodiment, the first field effect transistor 301, the second field effect transistor 302, and the third field effect transistor 303 are all P-channel metal-oxide-semiconductor (PMOS) field effect transistors; the fourth field effect transistor 304, the fifth field effect transistor 305, and the sixth field effect transistor 306 are all N-channel metal-oxide-semiconductor field effect transistors.

In the present embodiment, the offset voltage adjusting circuit 202 comprises a first adjusting portion. The first adjusting portion comprises an adjusting resistance 307.

The adjusting resistance 307 is used to adjust the offset voltage by adjusting a resistant value R of the first adjusting portion, wherein the offset voltage corresponds to a voltage of the first adjusting portion. The tenth connecting terminal 3053 is coupled with the eighth connecting terminal 3043 by the adjusting resistance 307, and the eleventh connecting terminal 3062 is coupled with the tenth connecting terminal 3053 by the adjusting resistance 307.

The adjusting resistance 307 comprises a thirteenth connecting terminal 3071 and a fourteenth connecting terminal 3072. The thirteenth connecting terminal 3071 is coupled with the tenth connecting terminal 3053. The fourteenth connecting terminal 3072 is coupled with the eighth connecting terminal 3043 and the eleventh connecting terminal 3062.

In the present embodiment, the offset voltage adjusting circuit 202 comprises a second adjusting portion.

The second adjusting portion is used to adjust the offset voltage by adjusting a current passing through the adjusting resistance 307.

The eleventh connecting terminal 3062 is coupled with the fourteenth connecting terminal 3072 through the second adjusting portion.

The second adjusting portion comprises a control voltage input terminal 203, a seventh field effect transistor 308, and an eighth field effect transistor 309.

The control voltage input terminal 203 is used to receive a control voltage. The control voltage is used to control the current passing through the adjusting resistance 307. The seventh field effect transistor 308 comprises a seventh control terminal 3081, a fifteenth connecting terminal 3082, and a sixteenth connecting terminal 3083. The seventh control terminal 3081 is coupled with the control voltage input terminal 203. The fifteenth connecting terminal 3082 is coupled with the fourteenth connecting terminal 3072. The sixteenth connecting terminal 3083 is coupled with the eleventh connecting terminal 3062. The eighth field effect transistor 309 comprises an eighth control terminal 3091, a seventeenth connecting terminal 3092, and an eighteenth connecting terminal 3093. The eighth control terminal 3091 is coupled with the control voltage input terminal 203. The eighth control terminal 3091 is further coupled with the seventeenth connecting terminal 3092. The eighteenth connecting terminal 3093 is coupled with the sixteenth connecting terminal 3083.

The seventh field effect transistor 308 and the eighth field effect transistor 309 are both N-channel metal-oxide-semiconductor field effect transistors.

In the present embodiment, the comparator 101 further comprises a ground terminal 1015. The ground terminal 1015 is used to be coupled with the sixteenth connecting terminal 3083.

A current passing through the first field effect transistor 301 is equal to a current passing through the second field effect transistor 302. A current passing through the seventh field effect transistor 308 is double the current passing through the second field effect transistor 302.

Specifically, in the present embodiment, each of the first field effect transistor 301, the second field effect transistor 302, and the seventh field effect transistor 308 may be realized by a first number of metal-oxide-semiconductors coupled in parallel, and the eighth field effect transistor 309 may be realized by a second number of metal-oxide-semiconductors coupled in parallel, where the first number is double the second number. For example, if the first number is 2N, the second number is N, N being a positive integer. For example, upon a condition that the first number is 2, the second number is 1, as shown in FIG. 3.

In the present embodiment, the first field effect transistor 301 and the second field effect transistor 302 form a current mirror. When the number of each of the metal-oxide-semiconductors (MOS) to which the first field effect transistor 301 and the second field effect transistor 302 are parallel coupled is 2N, a current $I\_Q1$ passing through the first field effect transistor 301 is equal to a current $I\_Q2$ passing through the second field effect transistor 302. If the seventh field effect transistor 308 and the eighth field effect transistor 309 form a current mirror, then a current $I\_Q8$ passing through the seventh field effect transistor 308 is double a current $I\_Q9$ passing through the eighth field effect transistor 309. So, $I\_Q1=I\_Q2=(I\_Q8)/2=I\_Q9$.

Since the current $I\_Q9$ is determined by the control voltage and the number of each of the metal-oxide-semiconductors (MOS) to which the eighth field effect transistor 309 is parallel coupled, then the current $I\_Q1$, the current $I\_Q2$, and the current $I\_Q8$ are determined. The voltage VR crossing the two sides of the adjusting resistance 307 (the offset voltage) is equal to $R*I\_Q2$.

In the present embodiment, while the first to-be-compared voltage is less than the third to-be-compared voltage, the fifth field effect transistor 305 and the third field effect transistor 303 are in an off-state, the sixth transistor 306 is in an on-state, and the comparative result outputted from the comparative result output terminal 1014 is a low voltage signal. While the first to-be-compared voltage is higher than or equal to the third to-be-compared voltage, the fifth field effect transistor 305 and the third field effect transistor 303 are in an on-state, the sixth transistor 306 is in an off-state, and the comparative result outputted from the comparative result output terminal 1014 is a high voltage signal.

In the technical proposal disclosed above, the offset voltage VR is adjusted by adjusting the control voltage or changing the resistant value R of the adjusting resistance, allowing the offset voltage of the comparator 101 of the present invention to be adjusted according to the user's needs. This increases the applicable situations of the comparator.

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:

1. A comparator, comprising:
    a power input terminal fed to electricity power supply;
    a first to-be-compared voltage input terminal used to receive a first to-be-compared voltage;
    a second to-be-compared voltage input terminal used to receive a second to-be-compared voltage;
    an offset voltage adjusting circuit used to adjust an offset voltage;
    a comparative circuit used to receive the first to-be-compared voltage and the second to-be-compared voltage, to compare the first to-be-compared voltage and a third to-be-compared voltage which is a sum of the second to-be-compared voltage and the offset voltage, and to generate a comparative result; and
    a comparative result output terminal used to output the comparative result;
    wherein the comparative circuit is coupled with the power input terminal, the comparative result output terminal, the offset voltage adjusting circuit, the first to-be-compared voltage input terminal, and the second to-be-compared voltage input terminal;
    the comparative circuit comprises:
        a first field effect transistor, comprising a first control terminal, a first connecting terminal coupled with the power input terminal, and a second connecting terminal coupled with the first control terminal; a second field effect transistor, comprising a second control terminal coupled with the first control terminal, a third connecting terminal coupled with the power input terminal, and a fourth connecting terminal;
        a third field effect transistor, comprising a third control terminal coupled with the fourth connecting terminal, a fifth connecting terminal coupled with the power input terminal, and a sixth connecting terminal coupled with the comparative result output terminal;
        a fourth field effect transistor, comprising a fourth control terminal coupled with the second to-be-compared voltage input terminal, a seventh connecting terminal coupled with the second connecting terminal, and an eighth connecting terminal;

a fifth field effect transistor, comprising a fifth control terminal coupled with the first to-be-compared voltage input terminal, a ninth connecting terminal coupled with the fourth connecting terminal, and a tenth connecting terminal coupled with the eighth connecting terminal;

a sixth field effect transistor, comprising a sixth control terminal coupled with the third control terminal, an eleventh connecting terminal coupled with the tenth connecting terminal, and a twelfth connecting terminal coupled with the comparative result output terminal;

the first field effect transistor and the second field effect transistor form a current mirror;

wherein the first field effect transistor, the second field effect transistor, and the third field effect transistor are all P-channel metal-oxide-semiconductor field effect transistors;

the fourth field effect transistor, the fifth field effect transistor, and the sixth field effect transistor are all N-channel metal-oxide-semiconductor field effect transistors wherein the offset voltage adjusting circuit comprises:

a first adjusting portion, comprising:

an adjusting resistance used to adjust the offset voltage by adjusting a resistant value of the first adjusting portion, the offset voltage corresponds to a voltage of the first adjusting portion;

the tenth connecting terminal is coupled with the eighth connecting terminal by the adjusting resistance, and the eleventh connecting terminal is coupled with the tenth connecting terminal by the adjusting resistance;

the adjusting resistance comprises a thirteenth connecting terminal coupled with the tenth connecting terminal and a fourteenth connecting terminal coupled with the eighth connecting terminal and the eleventh connecting terminal;

wherein the offset voltage adjusting circuit comprises:

a second adjusting portion used to voltage by adjusting a current passing through the adjusting resistance;

the eleventh connecting terminal is coupled with the fourteenth connecting terminal through the second adjusting portion;

wherein the second adjusting portion comprises:

a control voltage input terminal used to receive a control voltage, the control voltage is used to control the current passing through the adjusting resistance;

a seventh field effect transistor, comprising a seventh control terminal coupled with the control voltage input terminal, a fifteenth connecting terminal coupled with the fourteenth connecting terminal, and a sixteenth connecting terminal coupled with the eleventh connecting terminal; and an eighth field effect transistor, comprising an eighth control terminal coupled with the control voltage input terminal, a seventeenth connecting terminal coupled with the eight control terminal, and an eighteenth connecting terminal coupled with the sixteenth connecting terminal;

the comparator further comprises:

a ground terminal used to be coupled with the sixteenth connecting terminal.

2. The comparator according to claim 1, wherein each of the first field effect transistor, the second field effect transistor, and the seventh field effect transistor comprises a first number of the metal-oxide-semiconductors coupled in parallel;

the eighth field effect transistor comprises a second number of the metal-oxide-semiconductors coupled in parallel, the first number is double the second number.

3. The comparator according to claim 1, wherein a current passing through the first field effect transistor is equal to a current passing through the second field effect transistor;

a current passing through the seventh field effect transistor is double the current passing through the second field effect transistor.

4. The comparator according to claim 1, wherein the seventh field effect transistor and the eighth field effect transistor are both N-channel metal-oxide-semiconductor field effect transistors.

5. The comparator according to any one of claim 1, wherein while the first to-be-compared voltage is less than the third to-be-compared voltage, the fifth field effect transistor and the third field effect transistor are in an off-state, the sixth transistor is in an on-state, and the comparative result outputted from the comparative result output terminal is a low voltage signal;

while the first to-be-compared voltage is higher than or equal to the third to-be-compared voltage, the fifth field effect transistor and the third field effect transistor are in an on-state, the sixth transistor is in an off-state, and the comparative result outputted from the comparative result output terminal is a high voltage signal.

6. A comparator, comprising:

a power input terminal fed to electricity power supply;

a first to-be-compared voltage input terminal used to receive a first to-be-compared voltage;

a second to-be-compared voltage input terminal used to receive a second to-be-compared voltage;

an offset voltage adjusting circuit used to adjust an offset voltage;

a comparative circuit used to receive the first to-be-compared voltage and the second to-be-compared voltage, to compare the first to-be-compared voltage and a third to-be-compared voltage which is a sum of the second to-be-compared voltage and the offset voltage, and to generate a comparative result; and a comparative result output terminal used to output the comparative result;

wherein the comparative circuit is coupled with the power input terminal, the comparative result output terminal, the offset voltage adjusting circuit, the first to-be-compared voltage input terminal, and the second to-be-compared voltage input terminal;

wherein the comparative circuit comprises:

a first field effect transistor, comprising a first control terminal, a first connecting terminal coupled with the power input terminal, and a second connecting terminal coupled with the first control terminal;

a second field effect transistor, comprising a second control terminal coupled with the first control terminal, a third connecting terminal coupled with the power input terminal, and a fourth connecting terminal;

a third field effect transistor, comprising a third control terminal coupled with the fourth connecting terminal, a fifth connecting terminal coupled with the power input terminal, and a sixth connecting terminal coupled with the comparative result output terminal;

a fourth field effect transistor, comprising a fourth control terminal coupled with the second to-be-compared voltage input terminal, a seventh connecting terminal coupled with the second connecting terminal, and an eighth connecting terminal;

a fifth field effect transistor, comprising a fifth control terminal coupled with the first to-be-compared voltage terminal, a ninth connecting terminal coupled with the fourth connecting terminal, and a tenth connecting terminal coupled with the eighth connecting terminal;

a sixth field effect transistor, comprising control terminal coupled third control terminal, an eleventh connecting terminal coupled with the tenth connecting terminal, and a twelfth connecting terminal coupled with the comparative result output terminal;

wherein the first field effect transistor, the second field effect transistor, and the third field effect transistor are all P-channel metal-oxide-semiconductor field effect transistors;

the fourth field effect transistor, the fifth field effect transistor, and the sixth field effect transistor are all N-channel metal-oxide-semiconductor field effect transistors;

wherein the offset voltage adjusting circuit comprises:

a first adjusting portion, comprising:

an adjusting resistance used to adjust the offset voltage by adjusting a resistant value R of the first adjusting portion, the offset voltage corresponds to a voltage of the first adjusting portion;

the tenth connecting terminal is coupled with the eighth connecting terminal by the adjusting resistance, and the eleventh connecting terminal is coupled with the tenth connecting terminal by the adjusting resistance;

the adjusting resistance comprises a thirteenth connecting terminal coupled with the tenth connecting terminal and a fourteenth connecting terminal coupled with the eighth connecting terminal and the eleventh connecting terminal;

wherein the offset voltage adjusting circuit comprises:

a second adjusting portion used to adjust the offset voltage by adjusting a current passing through the adjusting resistance;

the eleventh connecting terminal is coupled with the fourteenth connecting terminal through the second adjusting portion;

wherein the second adjusting portion comprises:

a control voltage input terminal used to receive a control voltage, the control voltage is used to control the current passing through the adjusting resistance;

a seventh field effect transistor, comprising a seventh control terminal coupled with the control voltage input terminal, a fifteenth connecting terminal coupled with the fourteenth connecting terminal, and a sixteenth connecting terminal coupled with the eleventh connecting terminal; and an eighth field effect transistor, comprising an eighth control terminal coupled with the control voltage input terminal, a seventeenth connecting terminal coupled with the eight control terminal, and an eighteenth connecting terminal coupled with the sixteenth connecting terminal;

the comparator further comprises:

a ground terminal, coupled with the sixteenth connecting terminal.

7. The comparator according to claim 6, wherein each of the first field effect transistor, the second field effect transistor, and the seventh field effect transistor comprises a first number of the metal-oxide-semiconductors coupled in parallel;

the eighth field effect transistor comprises a second number of the metal-oxide-semiconductors coupled in parallel, the first number is double the second number.

8. The comparator according to claim 7, wherein the second number is 1 and the first number is 2.

9. The comparator according to claim 6, wherein
a current passing through the first field effect transistor is equal to a current passing through the second field effect transistor;

a current passing through the seventh field effect transistor is double the current passing through the second field effect transistor.

10. The comparator according to claim 6, wherein
the seventh field effect transistor and the eighth field effect transistor are both N-channel metal-oxide-semiconductor field effect transistors.

11. The comparator according to any one of claim 6, wherein
while the first to-be-compared voltage is less than the third to-be-compared voltage, the fifth field effect transistor and the third field effect transistor are in an off-state, the sixth transistor is in an on-state, and the comparative result outputted from the comparative result output terminal is a low voltage signal;

while the first to-be-compared voltage is higher than or equal to the third to-be-compared voltage, the fifth field elect transistor and the third field effect transistor are in an on-state, the sixth transistor is in an off-state, and the comparative result outputted from the comparative result output terminal is a high voltage signal.

* * * * *